United States Patent [19]
Ishii

[11] Patent Number: 5,657,538
[45] Date of Patent: Aug. 19, 1997

[54] METHOD OF CENTERING INTEGRATED CIRCUIT LEAD FRAME

[75] Inventor: Mitoshi Ishii, Ohita, Japan

[73] Assignee: Ishii Tool & Engineering Corpn., Ohita, Japan

[21] Appl. No.: 468,747

[22] Filed: Jun. 6, 1995

[30] Foreign Application Priority Data

Jun. 15, 1994 [JP] Japan ................. 6-157867

[51] Int. Cl.$^6$ ..................................... H05K 3/30
[52] U.S. Cl. ................. 29/832; 29/740; 29/701; 198/345.1
[58] Field of Search ............... 29/827, 833, 832, 29/740, 741, 854, 760, 593, 701; 198/345.1, 345.2

[56] References Cited

U.S. PATENT DOCUMENTS

| | | | |
|---|---|---|---|
| 4,776,080 | 10/1988 | Christensen | 29/833 X |
| 4,805,110 | 2/1989 | Takahashi et al. | 29/741 X |
| 4,833,776 | 5/1989 | Wakamiya et al. | 29/741 X |
| 4,958,722 | 9/1990 | Kobayashi et al. | 29/741 X |

FOREIGN PATENT DOCUMENTS 0 355 852  12/1991  European Pat. Off. .

Primary Examiner—Lary I. Schwartz
Assistant Examiner—Khan Nguyen
Attorney, Agent, or Firm—Armstrong, Westerman, Hattori, McLeland, & Naughton

[57] ABSTRACT

An IC lead frame centering method and apparatus whereby centering plates are automatically positioned to center various types of IC. With a screw driver (2) held with a hand, projections (48) of a rotating shaft (45) are inserted into driving bores (29) of a socket wrench (25), and pushed therein toward the socket wrench (25). The pressure causes the socket wrench (25) to slide on a screw rod (7) while compressing a coil spring (30). At the same time, the pressure causes the rotating shaft (45) to compress a coil spring (51), and also causes a cylindrical portion (47) of the rotating shaft (45) to move. The movement of the cylindrical portion (47) is detected by a start switch (52). Consequently, a servomotor (41) is started to drive the screw rod (7) to rotate, causing centering plates (16 and 17) to move away from each other until the centering plate 17 is detected by a mechanical origin sensor (24). The coordinate position of the centering plate (17) is recognized as a mechanical origin, and the centering plates (16 and 17) are moved from this position to a position at which the space therebetween conforms to the width of the IC, which has previously been stored in a centering position memory.

1 Claim, 6 Drawing Sheets

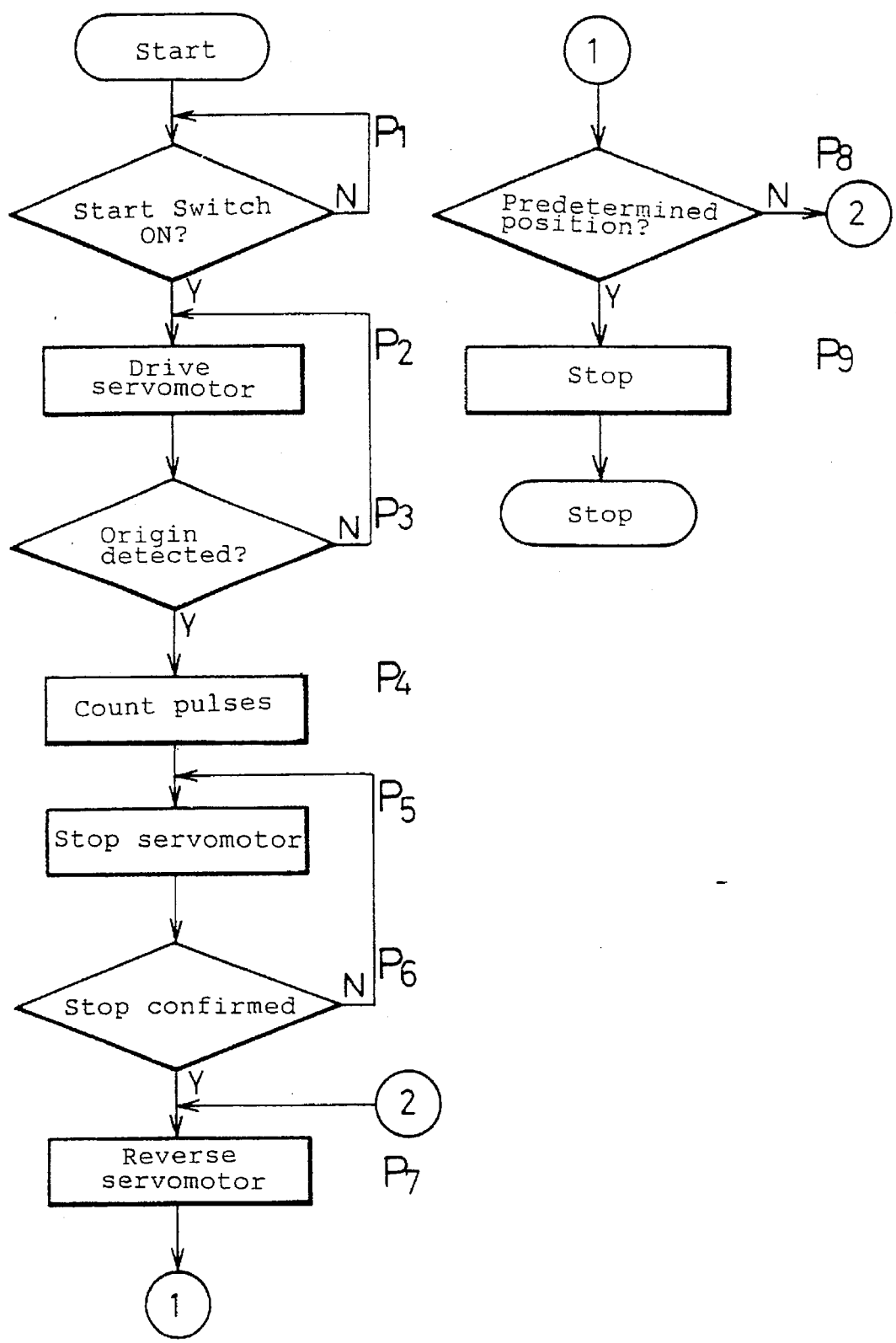

METHOD OF CENTERING INTEGRATED CIRCUIT LEAD FRAME

BACKGROUND OF THE INVENTION

1. Field of the Invention

The present invention relates to a method of, and apparatus for, centering an integrated circuit (IC) lead frame. More particularly, the present invention relates to an IC lead frame centering method for positioning ICs connected in series or a single IC, with a lead frame attached thereto, with respect to a center position for fabrication in a manufacturing system, or for positioning ICs of various sizes with respect to a center position on a transfer path to prepare for a subsequent process. The present invention also relates to an apparatus for carrying out the IC lead frame centering method.

2. Description of the Background Art

ICs are manufactured through various fabrication processes. An IC fabrication process in which a lead frame is used is roughly as follows: Upon completion of an IC chip, it is bonded to a lead frame, furnished with wiring, and covered with a plastic material to protect the wiring. Next, unnecessary portions of the lead frame are cut off, and then pin portions are bent into a desired shape by using a bending die, thereby completing an IC. During this fabrication process, the IC may be printed with information, for example, the type of IC, and/or inspected for performance by using an autohandler, if necessary.

Thus, working processes that require a lead frame are roughly divided as follows: processes which are carried out by using a chip holder and a wire bonder, respectively; a plastic molding process; a marking process; a pressing process; and a process which is carried out by using an autohandler. However, since lead frames vary in size from each other, the conventional practice is to center each lead frame by rotating screws so that the lead frame conforms to the apparatus used in each process. Thus, since there are many places where centering must be carried out, it takes a great deal of time.

If centering cannot appropriately be effected, the flow of lead frames becomes unfavorable, causing a large number of defectives to occur. Therefore, no inexperienced operator can be entrusted with the centering operation. Thus, the conventional IC lead frame centering method has been extremely inconvenient and uneconomical.

SUMMARY OF THE INVENTION

An object of the present invention is to provide an IC lead frame centering method which makes it possible to extremely shorten the setup time required to determine a center position of each of different types of IC lead frames in an IC manufacturing system (in the present invention, a setup which can be completed within 3 minutes is called "zero setup"), and also provide an apparatus for carrying out the IC lead frame centering method.

Another object of the present invention is to provide an IC lead frame centering method which makes it possible to determine a center position of each of different types of IC lead frames in an IC manufacturing system by using a compact and lightweight IC lead frame centering apparatus which can be readily attached to an existing IC manufacturing system, and also provide an apparatus for carrying out the IC lead frame centering method.

Still another object of the present invention is to provide an IC lead frame centering method which makes it possible to determine a center position of each of different types of IC lead frames in an IC manufacturing system at a reduced cost, and also provide an apparatus for carrying out the IC lead frame centering method.

A further object of the present invention is to provide an IC lead frame centering method which makes it possible to determine a center position of each of different types of IC lead frame in an IC manufacturing system with ease even by an inexperienced operator, and also provide an apparatus for carrying out the IC lead frame centering method.

To attain the above-described objects, the present invention provides an IC lead frame centering method wherein a space between centering plates is determined to position an IC lead frame. The method includes the steps of: detecting the position of a mechanical origin disposed to detect a mechanical intrinsic position of the centering plates; and determining a space between the centering plates from the position of the mechanical origin according to position data which has previously been stored.

In addition, the present invention provides an IC lead frame centering method wherein a space between centering plates is determined to position an IC lead frame. The method includes the steps of: storing position data concerning the centering plates; and moving the centering plates by only an amount corresponding to a difference between the position data and a position to which the centering plates are to be moved, thereby determining a space between the centering plates.

In addition, the present invention provides an IC lead frame centering apparatus which includes: centering plates for positioning an IC lead frame; a mechanism for adjusting the space between the centering plates; a mechanical origin sensor for detecting a mechanical intrinsic position of the centering plates and for determining an origin; a motor for driving the centering plates in order to adjust the space between the centering plates; a clutch device for coupling the driving motor to the space adjusting mechanism when the latter is to be driven; a memory for previously storing data concerning the space between the centering plates in conformity to the IC lead frame; and a device for controlling rotation of the driving motor according to the space data.

The IC lead frame centering apparatus may further include a mechanism for locking the space adjusting mechanism from operating when it is in an inoperative state.

BRIEF DESCRIPTION OF THE DRAWINGS

The above and other objects, features and advantages of the present invention will become more apparent from the following description of the preferred embodiments thereof, taken in conjunction with the accompanying drawings, in which like reference numerals denote like elements, and of which:

FIG. 7 is a flowchart showing one example of an operation of the screw driver controller.

DETAILED DESCRIPTION OF THE EMBODIMENTS

One embodiment of the present invention will be described below with reference to the accompanying drawings.

Figure 1:
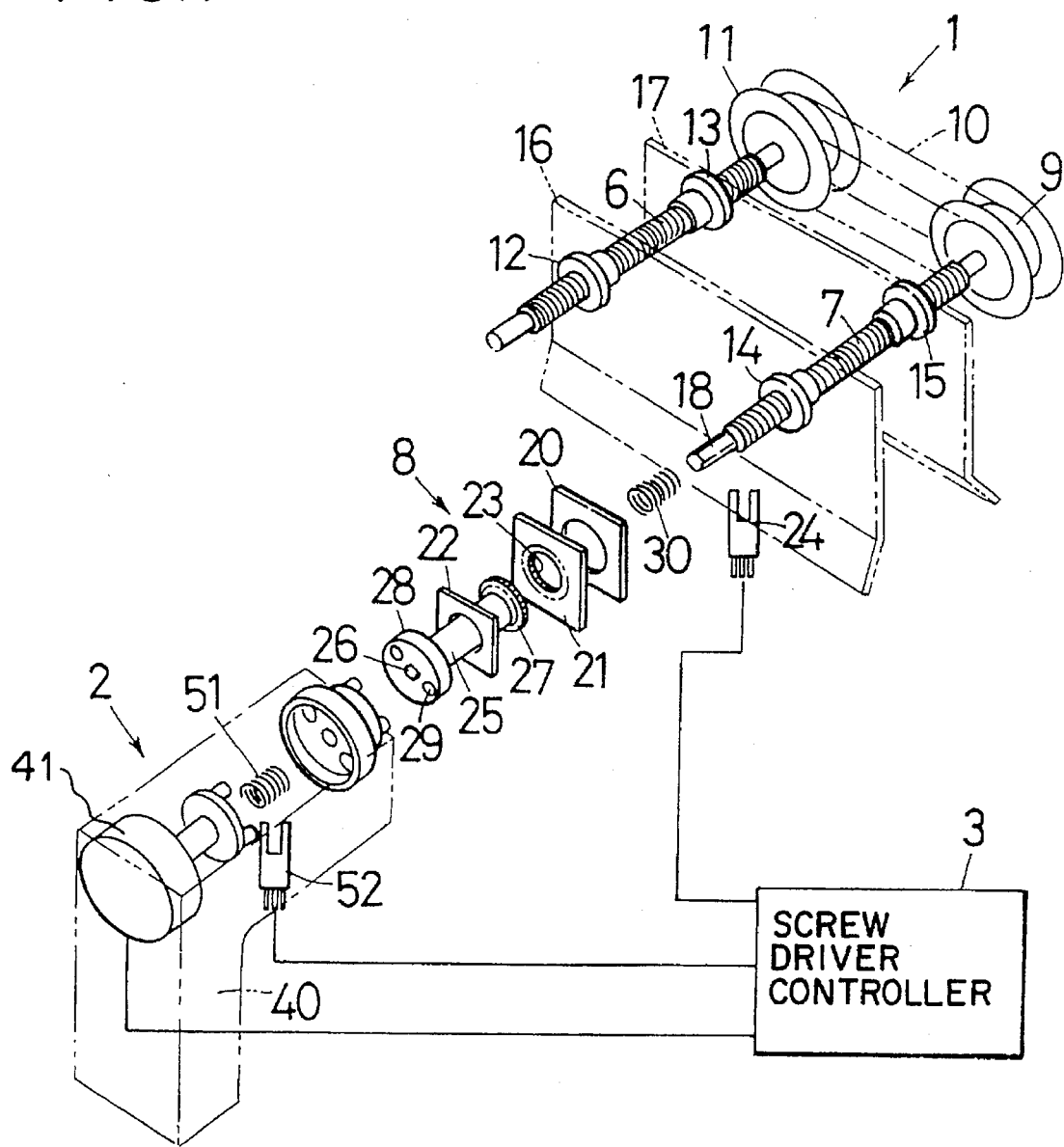
FIG. 1 is an exploded perspective view of an IC lead frame centering system according to one embodiment of the present invention.
Figure 2:
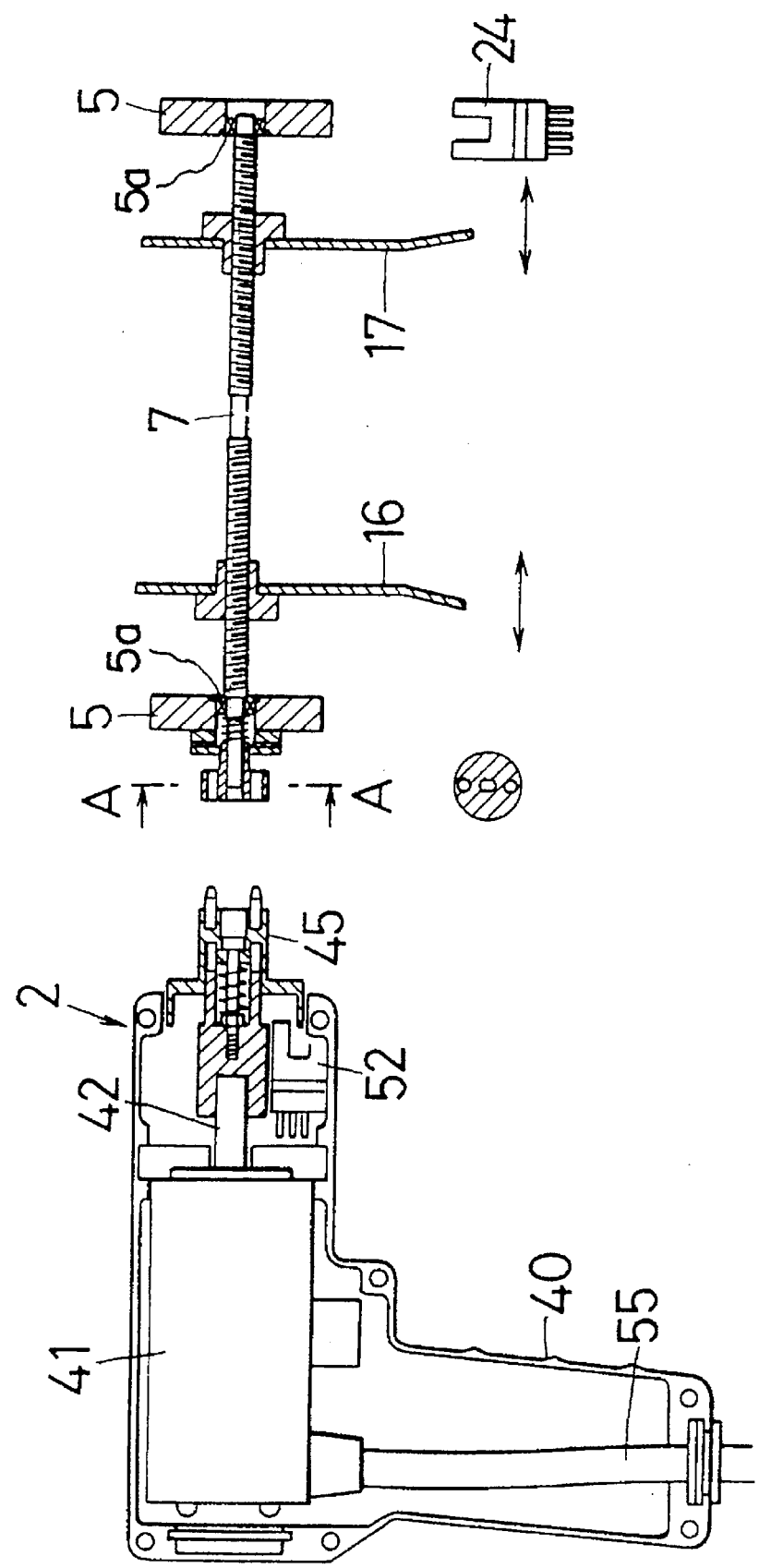
FIG. 2 is a sectional view of the IC lead frame centering system in its assembled state.

FIG. 1 is an exploded perspective view of an IC lead frame centering system, and FIG. 2 is a sectional view showing the IC lead frame centering system in its assembled state. The IC lead frame centering system has a centering device 1, a screw driver 2, and a screw driver controller 3. The centering device 1 guides an IC having a rectangular lead frame attached thereto (hereinafter referred to as simply "IC") so that the IC is centered in the lateral direction. The details of the structure of the centering device 1 are essentially the same as those of a known centering device (Japanese Patent Unexamined Publication (KOKAI) No. 5-155408) proposed by the present inventor.

A frame 5 constitutes an IC manufacturing system, a transfer path for transferring ICs from one process to another, an IC stocker, etc. A pair of parallel screw rods 6 and 7 are rotatably disposed on the frame 5 by being supported with a total of four bearings 5a. The screw rods 6 and 7 each have right- and left-hand threads cut thereon. A clutch and rotation preventing mechanism 8 is disposed at one end of the screw rod 7. The clutch and rotation preventing mechanism 8 transmits rotational power when the screw rod 7 is to be driven by the screw driver 2, and prevents rotation during the use of the centering device 1, as described later.

A timing pulley 9 is keyed to the other end of the screw rod 7. The timing pulley 9 is engaged with a timing belt 10. The timing belt 10 is engaged at the other end thereof with a timing pulley 11. The timing pulley 11 is secured to one end of the screw rod 6. Accordingly, the screw rods 6 and 7 are rotated in the same direction in interlocking relation to each other. The screw rods 6 and 7 have nuts 12, 13, 14 and 15 screwed onto the right- and left-hand threads, respectively.

A rectangular centering plate 16 is connected to the nuts 12 and 14. Similarly, a rectangular centering plate 17 is connected to the nuts 13 and 15. Side surfaces of the centering plates 16 and 17 contact side portions of the lead frame portion of an IC to effect positioning.

When the screw rod 7 is rotated by operating the clutch and rotation preventing mechanism 8, the rotation of the screw rod 7 is transmitted to the screw rod 6 through the timing pulley 9, the timing belt 10 and the timing pulley 11, thereby driving the screw rod 6 to rotate. The rotation of the two screw rods 6 and 7 causes the nuts 12, 13, 14 and 15 to move, thus eventually causing the centering plates 16 and 17 to move toward or away from each other across the center line. Accordingly, the IC is always positioned in the center of the centering device 1.

The above-described mechanism is a centering mechanism for the lateral direction. If necessary, a centering mechanism based on the same principle as the above may be disposed at the downstream side of the centering device 1 for positioning and centering in the longitudinal direction.

Figure 3:
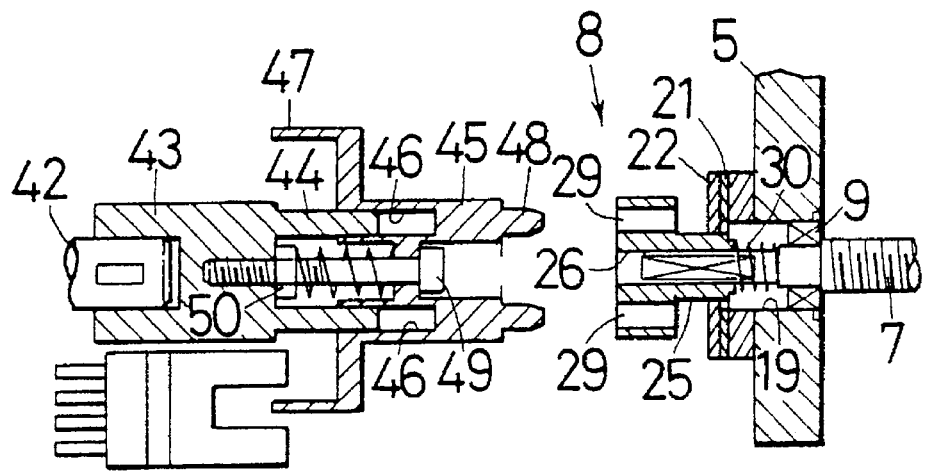
FIG. 3 is a fragmentary enlarged sectional view of a clutch portion of the system shown in FIG. 2.
Figure 5:
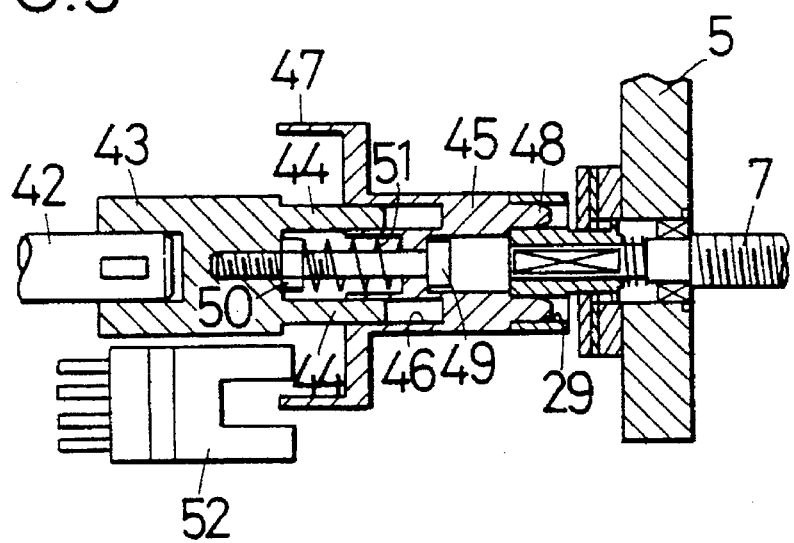
FIG. 5 is a fragmentary enlarged sectional view of a part of the arrangement shown in FIG. 4.
Figure 4:
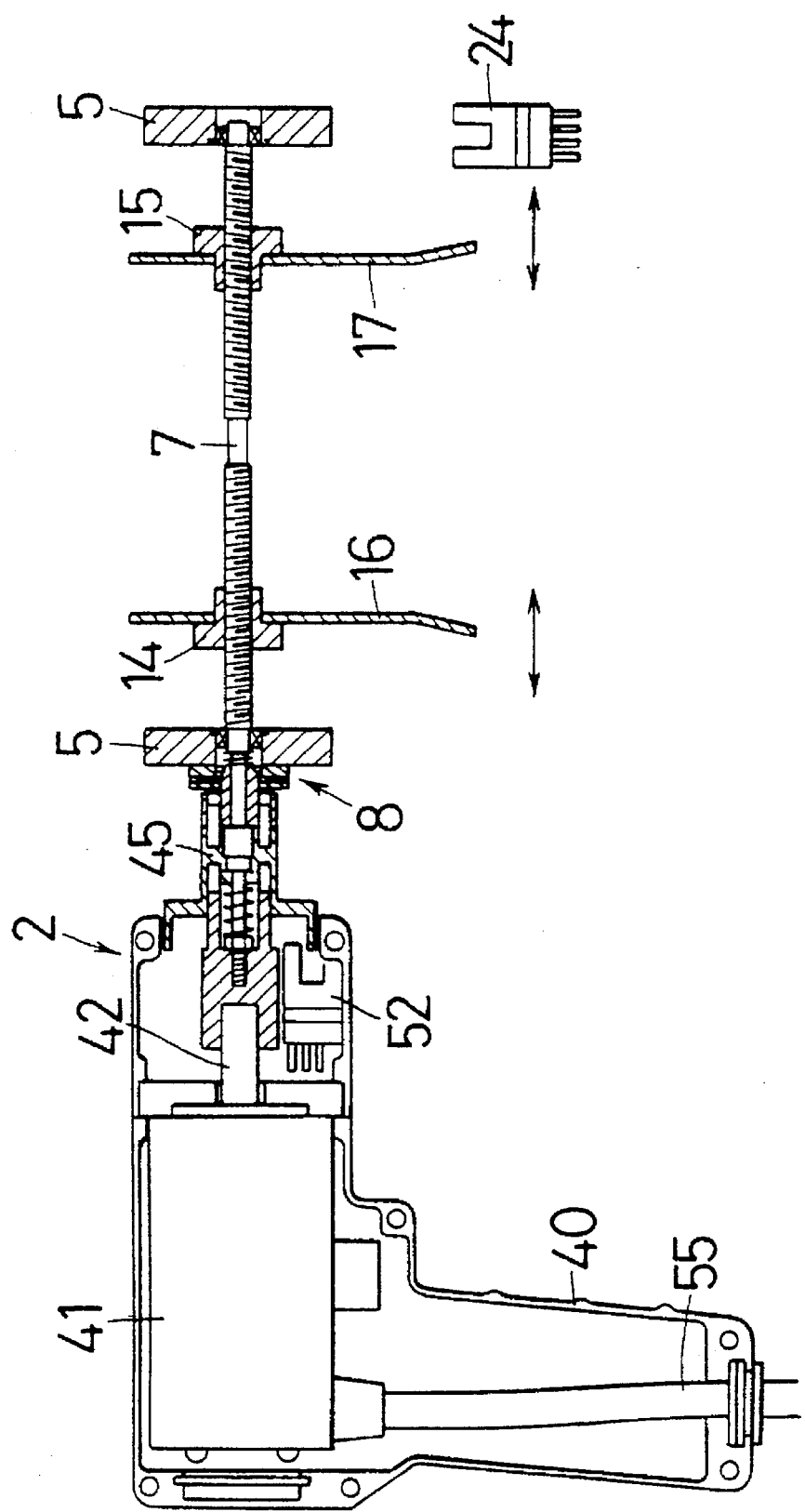
FIG. 4 is a sectional view of the IC lead frame centering system when a centering device is driven by a screw driver.

Clutch and rotation preventing mechanism 8:

The clutch and rotation preventing mechanism 8 is a mechanism for transmitting rotational power when the screw rod 7 is to be driven, and for preventing rotation so that the screw rod 7 will not move during the use of the centering device 1. One end of the screw rod 7 is formed with a pair of parallel end surfaces 18. As shown in FIG. 3, the screw rod 7 projects from a bearing bore 19 formed in the frame 5. A detent plate 21, which is put between a pair of clamping plates 20 and 22, is secured to a side surface of the frame 5 at the position of the bearing bore 19 by using bolts (not shown).

The detent plate 21 has a bore formed in the center thereof. The inner peripheral wall of the center bore of the detent plate 21 is formed with gear tooth-shaped mating teeth 23. The clamping plate 20 has a bore formed in the center thereof. The center bore of the clamping plate 20 and the bearing bore 19 have the same diameter. The clamping plate 22 has a bore formed in the center thereof. A socket wrench 25 is disposed in the center bore of the clamping plate 22 so as to be movable back and forth. The socket wrench 25 has a through-bore 26 in the center thereof. The through-bore 26 is similar in shape to the end of the screw rod 7 which is formed with the end surfaces 18, and enables the end of the screw rod 7 to be slidably inserted therein.

The socket wrench 25 has mating teeth 27 which are integrally formed on one end thereof. The mating teeth 27 are adapted to mesh with the mating teeth 23 of the detent plate 21. The socket wrench 25 further has a flange 28 which is integrally formed on the other end thereof. The flange 28 is formed with two driving bores 29 which are parallel to the through-bore 26. A coil spring 30 is interposed between the end surface of the screw rod 7 and the mating teeth 27 of the socket wrench 25.

The socket wrench 25 is pushed in the axial direction of the screw rod 7 by the coil spring 30, and the side surface of the mating teeth 27 is stopped by the side surface of the clamping plate 22. At this time, the screw rod 7 is locked from rotating because the mating teeth 27 of the socket wrench 25 and the mating teeth 23 of the detent plate 21 are the same gear teeth and in mesh with each other. The meshing is disengaged by pushing the socket wrench 25 against the coil spring 30. Consequently, the screw rod 7 is brought into a state where it can be driven to rotate by turning the socket wrench 25.

A mechanical origin sensor 24 for detecting a mechanical position of the centering plate 17 is secured to the frame 5. The mechanical origin sensor 24 is a sensor for detecting a mechanical origin of the centering plate 17, which is a mechanical intrinsic position, and from which a program is produced.

Screw driver 2:

The screw driver 2 is a device for driving the socket wrench 25 to rotate. The screw driver 2 has an approximately pistol-like outer shape. A casing 40 of the screw driver 2 is made of a casting, and has a grip portion which is to be held with a hand. The casing 40 contains a servomotor 41 which is secured inside the casing 40. A coupling shaft 43 is secured to the distal end of an output shaft 42 of the servomotor 41 by using a key and screw (not shown).

The coupling shaft 43 has two projections 44 which are integrally formed on the distal end thereof. The projections 44 have a cylindrical cross-sectional configuration, and extend parallel to the center axis of the coupling shaft 43. The projections 44 are inserted into respective coupling holes 46 which are formed in the rear end of a rotating shaft 45 so that the projections 44 are slidable in the direction of the center axis. The rotating shaft 45 has a cylindrical portion 47 which is integrally formed on the rear end thereof. The forward end of the rotating shaft 45 is formed with two projections 48 for rotational drive.

The center of the rotating shaft 45 is pierced with a bolt 49. The distal end of the bolt 49 is screwed into the coupling shaft 43. The bolt 49 is secured to the coupling shaft 43 by a lock nut 50. A coil spring 51 is interposed between the lock nut 50 and the rotating shaft 45 to cause the coupling shaft 43 and the rotating shaft 45 always to separate from each other. The position of the cylindrical portion 47, that is, the position of the rotating shaft 45, is detected by a start switch 52, which is a proximity switch.

Figure 6:
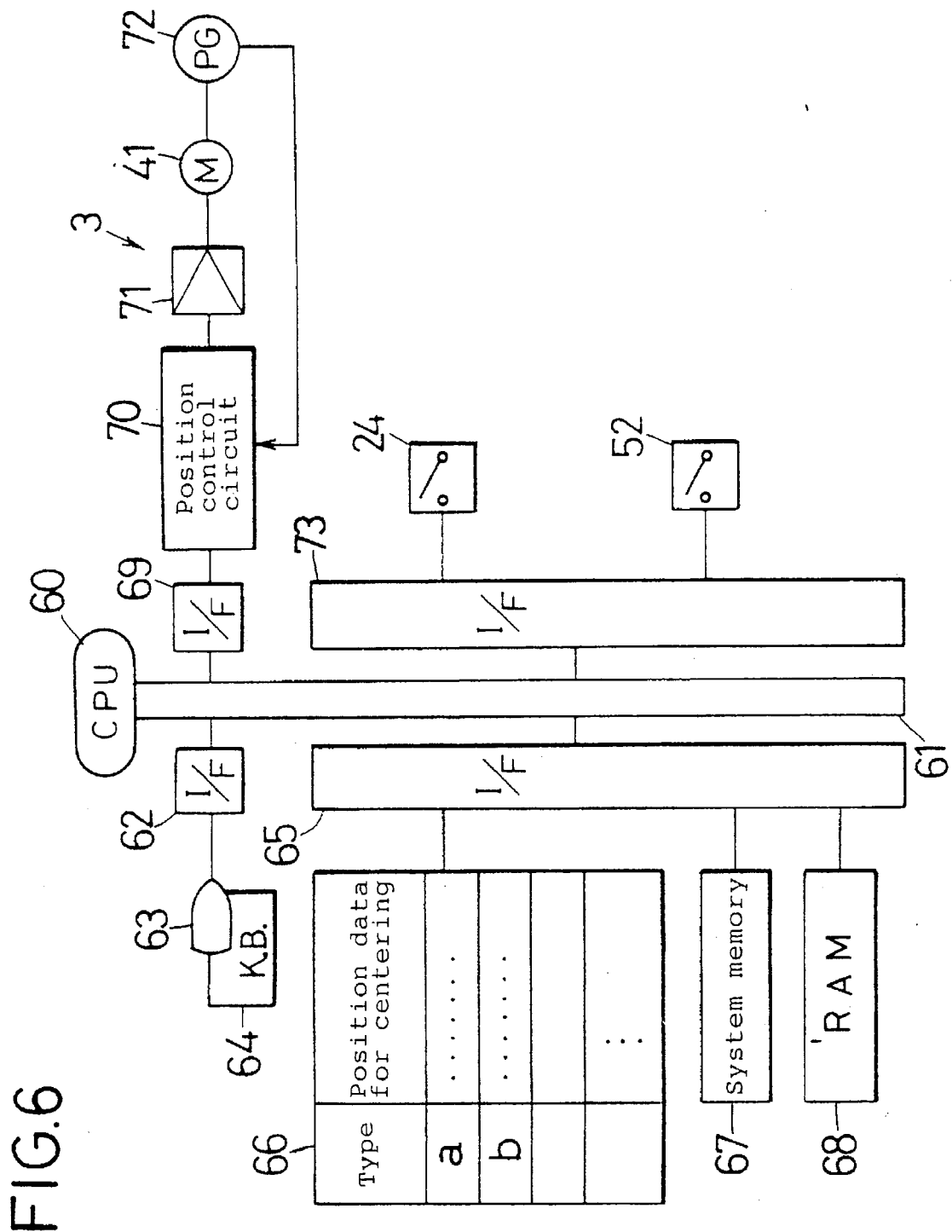
FIG. 6 is a functional block diagram of a screw driver controller used in the IC lead frame centering system.

Screw driver controller 3:

The servomotor 41 is connected to the screw driver controller 3 through a power line and control signal line 55. The screw driver controller 3 controls the rotation of the servomotor 41, and also controls the position of the centering plate 17. FIG. 6 is a functional block diagram showing an outline of the screw driver controller 3. A CPU 60 is a central control unit for generally controlling the whole screw driver controller 3.

The CPU 60 is connected with a display device, various memories, and sensors through a bus 61. In this embodiment, the display device 63 is a liquid crystal display device which is disposed together with a keyboard 64 as one unit, and connected to the CPU 60 through an interface 62 and the bus 61. A centering position memory 66 is a memory area for storing a centering space and screw rod installation position (installation Number) for each type of IC as data.

The data can be rewritten and stored from the keyboard 64 through the CPU 60, the bus 61 and an interface 65. A system memory 67 is a memory for storing a program used to allow the screw driver controller 3 to perform basic functions as a controller, such as display for controlling the screw driver controller 3, and rewriting data. A RAM 68 is mainly used to temporarily store data and a program during the operation of the controller 3.

The rotation of the servomotor 41 is controlled through an interface 69, a position control circuit 70, and an amplifier 71. A pulse generator 72 for detecting a number of revolutions is coupled to the output shaft of the servomotor 41. Output pulses from the pulse generator 72 are fed back to the position control circuit 70 to count the number of output pulses and also detect a speed. Counting the number of pulses and detecting the speed make it possible to control the speed and number of revolutions of the servomotor 41.

The mechanical origin sensor 24 and the start switch 52 are connected to the CPU 60 through an interface 73 so that ON/OFF signals from these elements can be detected by the CPU 60.

Operation:

An operation of the above-described arrangement and a method of using it will be roughly explained below. Position data concerning the centering device 1 in an IC manufacturing system which requires centering is inputted to, and stored in, the centering position memory 66 from the keyboard 64. With the screw driver 2 held by hand, the projections 48 of the rotatable shaft 45 are inserted into the driving bores 29 of the socket wrench 25, and pushed therein toward the socket wrench 25.

Receiving the pressure, the socket wrench 25 compresses the coil spring 30, and while doing so, it slides on the screw rod 7. At the same time, the pressure causes the rotating shaft 45 to compress the coil spring 51, and also causes the cylindrical portion 47 of the rotating shaft 45 to move. The movement of the cylindrical portion 47 is detected by the start switch 52, which is a proximity switch. When the start switch 52 detects the movement of the cylindrical portion 47, the CPU 60 issues a start command to the servomotor 41.

In response to the start command, the servomotor 41 drives the screw rod 7 to rotate in a direction in which the centering plates 16 and 17 move away from each other. The rotation of the screw rod 7 is transmitted to the screw rod 6 through the timing pulley 9, the timing belt 10 and the timing pulley 11, thereby causing the screw rod 6 to rotate. The rotation of the two screw rods 6 and 7 causes the nuts 12, 13, 14 and 15 to move, thus eventually causing the centering plates 16 and 17 to move away from each other across the center line.

By the expanding motion, the centering plate 17 moves until it is detected by the mechanical origin sensor 24. When the centering plate 17 is detected by the mechanical origin sensor 24, the CPU 60 recognizes the coordinate position of the centering plate 17 as a mechanical origin, and immediately issues a stop command to the servomotor 41. The CPU 60 then issues a reverse rotation command to the servomotor 41 to cause the centering plates 16 and 17 to move toward each other across the center line.

The amount of movement of the centering plates 16 and 17 has previously been stored in the centering position memory 66 as a distance determined by counting from the mechanical origin in accordance with the width of the IC. That is, the number of revolutions of the servomotor 41 has previously been determined. When the centering plates 16 and 17 reach the stored position, the servomotor 41 is immediately stopped.

Other embodiments:

Although in the above-described embodiment the position of the mechanical origin is detected by movement of the centering plates 16 and 17, the centering plates 16 and 17 may be indirectly detected by detecting the angle of rotation of the screw rods 6 and 7, or the position of the nuts 12, 13, 14 and 15. Although in the above-described embodiment the centering plates 16 and 17 are always detected by the mechanical origin sensor 24 before being moved to a predetermined position, it is also possible to adopt a method in which a position to which the centering plates 16 and 17 have been driven in a previous operation is stored in a memory, and the centering plates 16 and 17 are moved by only an amount corresponding to a variation from the stored position.

Although in the above-described embodiment no sensor is disposed for detecting the absolute position of the centering plates 16 and 17, the arrangement may be such that the absolute position of the centering plates 16 and 17 is always detected by using a known magnetic scale, or a pulse generator for detecting the absolute position.

As has been detailed above, the IC lead frame centering method and apparatus according to the present invention enable even an inexperienced operator to speedily adjust the space between the centering plates. In addition, even when different types of IC lead frame are to be handled, the space between the centering plates can be accurately adjusted without the need for storing numerical data, or the like.

Although the present invention has been described through specific terms, it should be noted here that the described embodiments are not necessarily exclusive and that various changes and modifications may be imparted thereto without departing from the scope of the invention which is limited solely by the appended claims.

What is claimed is:

1. A method for centering an integrated circuit lead frame wherein a space between centering plates is produced to position said lead frame at a desired location for attaching electronic components thereon, comprising the steps of:

providing centering plates;

storing position data concerning said centering plates based upon various types of lead frames;

detecting a position of mechanical origin establishing a mechanical intrinsic position of said centering plates;

producing the space between said centering plates by moving said centering plates from said mechanical intrinsic position by an amount corresponding only to a difference between a position determined by said position data and a position to which said centering plates are to be moved.

* * * * *